(12) United States Patent
Squibb

(10) Patent No.: US 6,621,517 B1
(45) Date of Patent: Sep. 16, 2003

(54) VIEWING AND IMAGING SYSTEMS

(75) Inventor: Frank Norman Squibb, Weymouth (GB)

(73) Assignee: DEK International GmbH, Zurich (CH)

(*) Notice: Subject to any disclaimer, the term of this patent is extended or adjusted under 35 U.S.C. 154(b) by 0 days.

(21) Appl. No.: 09/380,950

(22) PCT Filed: Mar. 9, 1998

(86) PCT No.: PCT/GB98/00696
§ 371 (c)(1),
(2), (4) Date: Nov. 15, 1999

(87) PCT Pub. No.: WO98/42510
PCT Pub. Date: Oct. 1, 1998

(30) Foreign Application Priority Data

Mar. 25, 1997 (GB) .............................................. 9706148

(51) Int. Cl.⁷ .............................. H04N 7/18; H04N 9/47
(52) U.S. Cl. .............................. 348/87; 348/95; 348/94; 348/131; 348/132
(58) Field of Search .......................... 348/95, 94, 131, 348/132, 87; 358/101; 101/486

(56) References Cited

U.S. PATENT DOCUMENTS

| | | | |
|---|---|---|---|
| 4,385,238 A | 5/1983 | Westerberg et al. | 250/491 |
| 4,651,203 A | 3/1987 | Peterson | 358/101 |
| 5,060,063 A * | 10/1991 | Freeman | 358/101 |
| 5,241,187 A | 8/1993 | Ikeda et al. | 250/548 |
| 5,257,063 A * | 10/1993 | Ishimaru | 354/416 |
| 5,752,446 A * | 5/1998 | Squibb | 101/486 |
| 5,943,089 A * | 8/1999 | Douglas | 348/87 |

FOREIGN PATENT DOCUMENTS

| | | | |
|---|---|---|---|
| DE | 3928527 A1 | 3/1991 | B41F/15/16 |
| DE | 42 17 430 | 12/1993 | H04N/3/00 |
| EP | 0204901 A2 | 12/1986 | H05K/3/00 |
| EP | 0 469 856 | 2/1992 | G02B/27/02 |
| GB | 2032729 A | 5/1980 | H04N/9/04 |
| GB | 2130738 A | 6/1984 | G03B/27/32 |
| GB | 2212689 A | 7/1989 | H04N/5/30 |
| WO | WO 95 14575 | 6/1995 | B41F/33/00 |
| WO | WO-98/07569 | 2/1998 | B41F/33/00 |

* cited by examiner

Primary Examiner—Chris Kelley
Assistant Examiner—Charles Parsons
(74) Attorney, Agent, or Firm—Orrick, Herrington, & Sutcliffe LLP

(57) ABSTRACT

A viewing and imaging system is provided for use in a screen printer. Light is supplied to the screen and/or the board from a number of independently controller light sources. According to one aspect of the invention, one light source provides substantially collimated light and another light source provides diffuse light. The light sources are controlled by a controller that pulses the light sources in order to provide a stroboscopic image of the board and screen. The duration of the pulses is adjusted to adjust the effective brightness of the light sources. The timing of the pulses are adjusted so that the temporal midpoints of pulses from each of the light sources are coincident.

8 Claims, 7 Drawing Sheets

VIEWING AND IMAGING SYSTEMS

FIELD OF THE INVENTION

This invention relates to viewing and imaging systems for particular, though not exclusive, application in the field of screen printers for applying solder paste to printed circuit boards. The following description will focus on screen printer applications, but it will be understood that the various aspects of the invention find application in other areas where similar techniques are used.

BACKGROUND

In screen printers for printed circuit boards, the screen is positioned over the circuit board and solder paste is applied to the board through apertures in the screen. To ensure that the solder paste is printed at the correct locations on the board for subsequent component placement, the screen must be aligned with the board prior to printing" To perform the alignment, an imaging device such as a video probe is generally moved between the screen and board to view reference marks, or "fiducials", at corresponding positions on the screen and board. Images of corresponding fiducials on the screen and board are relayed to vision processing apparatus. The vision processing apparatus determines the relative mis-alignment of the screen and board from the positions of the fiducials in the acquired images, and the relative position of the screen and board is adjusted to achieve alignment to prior to printing.

The general arrangement of one type of screen printer is illustrated in FIG. 1 of the accompanying drawings. The circuit board 1 to be printed is supported by a base (not shown) of the printer in a generally horizontal plane parallel to the x and y axes shown in the figure. A screen 2 is supported in a frame 2a so as to lie above, and generally parallel to, the board 1. The position of the screen 2 in the xy plane can be adjusted by means of screen positioning motors 3 the operation of which is controlled by a position controller 4. The support frame 2a and screen positioning motors 3 are mounted in a printhead portion (not shown) of the printer which can be pivoted away from the base to allow access when necessary, for example to adjust the board support. The apparatus includes an imaging device 5 which is mounted on an XY table (not shown) for movement in a horizontal plane between the board 1 and screen 2. The position of the imaging device 5 is also controlled by the position controller 4.

The surface of the screen 2 facing the board 1 has a plurality of reference marks, or screen fiducials, 6a and 6b thereon. The surface of the board 1 facing the screen 2 has corresponding board fiducials 7a and 7b. The positions of the board and screen fiducials are such that when each pair of corresponding fiducials 6a, 7a and 6b, 7b are in alignment, the screen is correctly aligned relative to the board for the subsequent printing operation to be performed after simply raising the board into contact with the screen by means of a mechanism provided in the base of the printer.

The imaging device 5 is operated so as to acquire images of the fiducials 6, 7 and the acquired images are supplied to a vision processor 8 which is programmed to determine the locations of the fiducials in the images. The fiducial location data is then supplied to the position controller 4 for adjusting the position of the screen 2 to bring the corresponding fiducials 6a, 7a and 6b, 7b, and hence the board and screen, into alignment. A video monitor 9a allows an operator to monitor images supplied to the vision processor 8. An operator interface 9b is connected to the position controller 4 to allow operator control of the apparatus, eg. during preliminary set up procedures.

The general arrangement of a known imaging device 5 is illustrated schematically in FIG. 2 of the drawings. Here, the imaging device is a video probe comprising a CCD camera 11 and an optical system indicated generally at 12. The optical system 12 comprises screen and board lighting indicated schematically at 13 and 14 respectively. The screen and board lighting 13 and 14 constitutes "direct lighting" for illuminating the regions A and B of the screen and board with substantially collimated light as indicated by the arrows in the figure. The direct lighting 13, 14 can be implemented in a number of ways, for example by optical arrangements which receive light from sources at one side thereof and reflect the light upwardly/downwardly towards the screen/board. As indicated by the bold arrows in the figure, light reflected from the screen and board is incident on reflecting means 16 in a return light channel 17 of the system which is indicated schematically by the broken lines in the figure. The reflecting means 16 may be, for example, a prism arrangement which reflects incident light from the screen/board along the return light channel 17. The return light is transmitted along the channel 17 via various optics (not shown) to the CCD camera 11. The illuminated regions of the screen and board may be imaged side by side on the CCD array.

While the direct light, which is nominally Perpendicular to the screen and board, is sufficient for viewing fiducials for alignment purposes, if the probe 5 is also to be used for inspection purposes then it is desirable for additional, diffuse lighting to be provided. In particular, if the probe is to be used to inspect the screen 2 for aperture blockage or contamination, or to inspect the board 1 for missing, mis-aligned or excess print, then the direct light may be insufficient to enable the required features to be distinguished. However, the location of the direct screen and board lighting 13, 14 above and below the return light channel 17 as shown in FIG. 2 means that in practice there is inadequate space to provide the required diffuse lighting on the probe if a practical compact design is to be achieved.

SUMMARY OF THE INVENTION

According to one aspect of the present invention there is provided viewing apparatus for location between a screen and board in a screen printer for viewing opposing regions of the screen and board, the apparatus comprising:

reflecting means for reflecting incident light from the screen and board along a return light channel;

beamsplitter means in the return light channel for transmission of incident light from the reflecting means along the return light channel:

lighting means, comprising first and second light sources, for illuminating the beamsplitter means, the beamsplitter means being arranged for reflecting light from the first and second light sources towards the reflecting means and the reflecting means being arranged for further reflecting the light from the first and second light sources towards the screen and board respectively, and a light barrier, extending between the beamsplitter and reflecting means, for inhibiting cross-talk between light from the first and second light sources reflected by the beamsplitter means.

In embodiments of this aspect of the invention, therefore, the light for illuminating the screen and board is introduced into the return light channel while cross-talk between the screen and board lighting is inhibited by the light barrier. This frees the areas occupied by the screen and board lighting 11, 14 in the arrangement of FIG. 2, so that a compact design can be achieved and the regions occupied by the screen and board lighting 13, 14 in FIG. 2 can be used for diffuse lighting means if desired.

While arrangements can be envisaged where the light from the first and second light sources is introduced into the return light channel from above (screen side) and below (board side), it is preferred that the lighting means is located laterally of the return light channel. Further, while arrangements can be envisaged where the light from the first and second light sources is introduced into the return light channel from opposite sides thereof, it is preferred that the lighting means is located on one side only of the return light channel so that light from both light sources is introduced from the same side. With this arrangement at least, it is preferred that the light barrier further extends between the lighting means and the beamsplitter means to inhibit cross-talk between light from the first and second light sources incident on the beamsplitter means.

Depending on the particular arrangement of the optical system, the light barrier may comprise a thin membrane, such as a thin metal sheet or a layer or coating of some other suitable material. The membrane is preferably substantially non-reflective. In preferred embodiments, the light barrier is generally perpendicular to the direction of light reflected towards the screen and board by the reflecting means, and is most preferably substantially aligned with the optical axis of the return light channel.

Through provision of the light barrier, in operation of the lighting means the screen is illuminated substantially only by the first light source, and the board is illuminated substantially only by the second light source. This facilitates efficient operation and is particularly important where, as in preferred embodiments, the light sources are independently operable and/or adjustable. For example, if during set-up the operator adjusts the intensity of one light source to optimise, say, the screen lighting, the adjustment will not effect the board lighting and vice versa.

Referring again to FIG. 2, in some cases the screen and board lighting 13, 14 may be strobed to instantaneously illuminate the screen and board fields of view. This allows fiducial capture (ie. acquisition of fiducial images to be performed while the probe is in motion between the screen and board. Of course, while the provision of suitable optics in the return channel 17 of FIG. 2 allows the screen and board to be viewed simultaneously, in other arrangements where a probe looks only in one direction, or only one direction at a time, it may also be desirable to strobe or pulse the lighting. While strobe lighting might be used in normal operation for fiducial capture, in practice continuous lighting is also required, eg. during set-up to allow the operator to view the video image on the monitor 9a (FIG. 1) and perform the necessary set-up procedures. However, continuous lighting gives a different lighting effect to the strobe lighting used during fiducial capture, and this can make it difficult to optimise the various system parameters during set-up. A further drawback of continuous lighting generally is that it can result in image blur when the probe is in motion, making, precision measurements difficult or impossible.

According to another aspect of the present invention there is provided a video probe for generating a video signal representing images of regions of a screen and/or board in a screen printer, the video probe comprising:

lighting means for illuminating regions to be viewed;

control means for controlling the lighting means to generate pulses of light; and imaging means for acquiring images of the regions illuminated by the light pulses and generating a video signal representing the images so acquired, wherein the control means is operable in a first mode to control the lighting means to generate light pulses repeatedly at a sufficient rate to produce a video signal which, when displayed to an operator, is perceived as a substantially continuous picture.

In accordance with this aspect of the Invention, therefore, a pseudo-continuous lighting effect is achieved by using repetitive light pulses. An operator monitoring the video signal therefore sees a substantially continuous video picture similar to prior arrangements where true continuous lighting was used. However, since the lighting is in fact pulsed, the effect of probe movement on the resulting images can be substantially reduced as compared with true continuous lighting. Further, where the lighting means will be strobed to capture a single image during normal operation, eg. for fiducial capture, the lighting effect of the repetitive pulses will be much closer to the conditions during normal operation.

To avoid flicker in the displayed image, the repetitive light pulses are preferably generated in synchronism with the video signal. It is particularly preferred that the pulses are generated at the frame rate of the video signal for conformity with the conditions during normal operation, where one frame is acquired from one pulse of light, and to provide a high quality video picture for monitoring, though a lower pulse rate might produce an apparently continuous video image which is acceptable for some purposes.

As indicated, the lighting means may be the direct lighting used for fiducial capture in normal operation. Alternatively or in addition, the lighting means may be diffuse lighting means used for inspection purposes, allowing inspection to be performed with the probe in motion. In automated inspection processes, the diffuse lighting may also be triggered for single image capture. In both cases, therefore, the control means may be operable in a second mode to control the lighting means to generate pulses of light at times dependent upon external control signals received by the control means. This second, triggered mode can then be used for single image capture when required.

Where a plurality of light sources are used in the imaging device, it may be desirable for these to be of different intensity, and further to be adjustable in intensity. For example, independent light sources may be used for direct lighting of the screen and board. As a further example, if the imaging device is to be used for inspection as well as for fiducial capture, as discussed above it is desirable to provide additional diffuse lighting. This may be of different intensity to the direct lighting used for fiducial capture, and may itself comprise a plurality of separate light sources to provide light from varying angles.

According to a further aspect of the present invention there is provided imaging apparatus for acquiring images of regions of a screen and/or board in a screen printer, the apparatus comprising:

a plurality of lighting means for illuminating regions to be imaged;

control means for controlling each lighting means to generate a pulse of light: and imaging means for acquiring images of the regions illuminated on activation of the lighting means, wherein the control means is operable to control the plurality of lighting means to generate respective pulses of different durations such that the temporal midpoints of pulses from respective lighting means are coincident.

In embodiments of this aspect of the invention, therefore, the imaging device can include a plurality of lighting means which can generate pulses of different durations, ie. different temporal pulse widths, but though the pulse widths for different lighting means are different, the pulses are centred at the same point in time. Since the effective intensity of light from different lighting means is dependent on the pulse width, this allows the various lighting means to produce different intensity light in a strobe situation, the coincident light pulses "freezing" the image at a single point in time.

The plurality of lighting means may comprise direct lighting means and/or diffuse lighting means such as may be used for inspection purposes. Further in preferred embodiments the control means is operable to vary the pulse duration, and hence effective intensity, of one or more, and preferably all, of the lighting means in response to a control input. Thus, the intensity of individual lighting means can be varied independently of the others, while the light pulses from different sources are still centred on the same point in time by the control means.

As in embodiments of the second aspect of the invention, the control means may be operable in a first mode to control the lighting means to generate light pulses repeatedly, preferably in synchronism with a video signal output by the imaging means, and most preferably at the frame rate of the video signal. The control means may also be operable in second mode to trigger the lighting means to generate pulses at times dependent on external control signals received the control means.

In general, systems may embody more than one of the various aspects of the invention discussed above. Moreover, when features are described herein with reference to apparatus according to the invention, corresponding features may be provided in a method of the invention, and vice versa.

BRIEF DESCRIPTION OF THE DRAWINGS

Embodiments of the invention will now be described, by way of example, with reference to the accompanying drawings in which:

FIG. 3a is a plan view of the probe with the top cut away to illustrate the viewing apparatus. FIG. 3b is a schematic cross-section along line I—I of FIG. 3a showing a side view of the probe. FIG. 3c is a schematic cross-section along line II—II of FIG. 3a showing an end view of the probe. In FIGS. 3b and 3c, the probe 20 is shown located between a screen 2 and board 1 to be viewed.

DETAILED DESCRIPTION

Figure 3A:
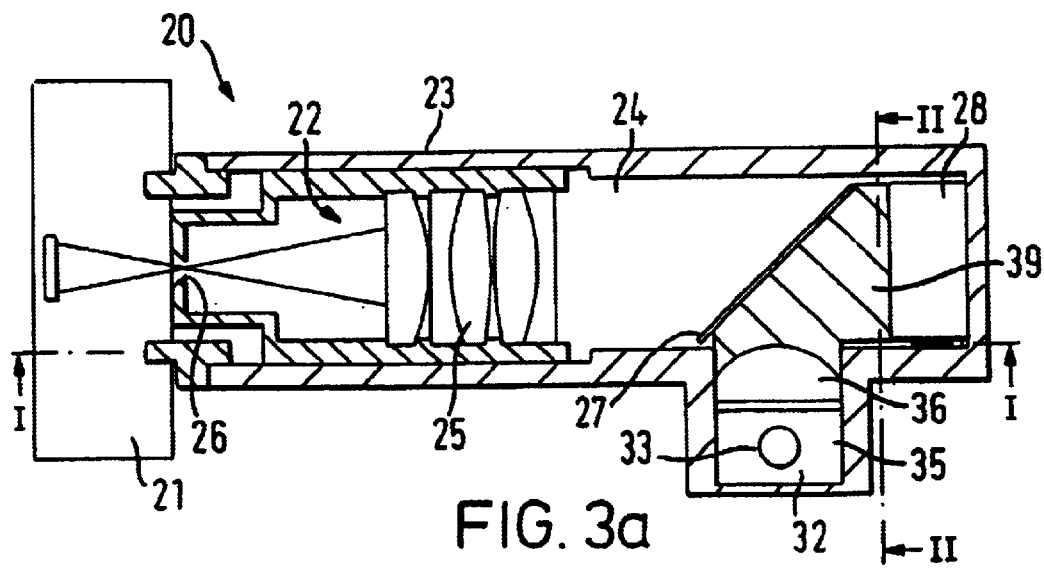
FIGS. 3a, 3b and 3c are schematic views, partially cut away, of an imaging device in the form of a video probe 20 embodying the invention.
Figure 3B:
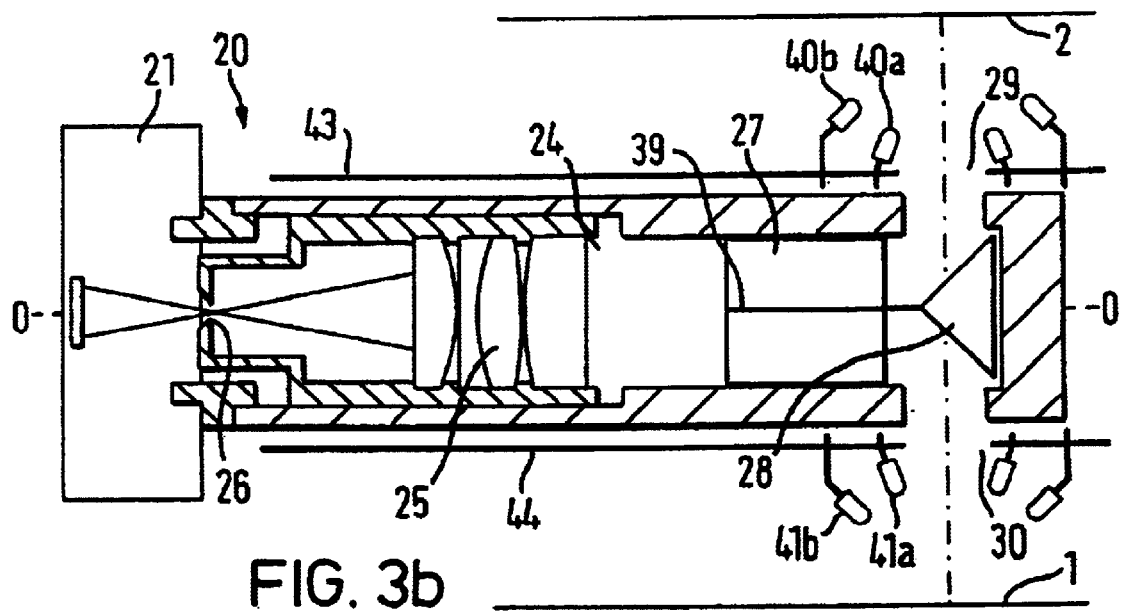
Figure 3C:
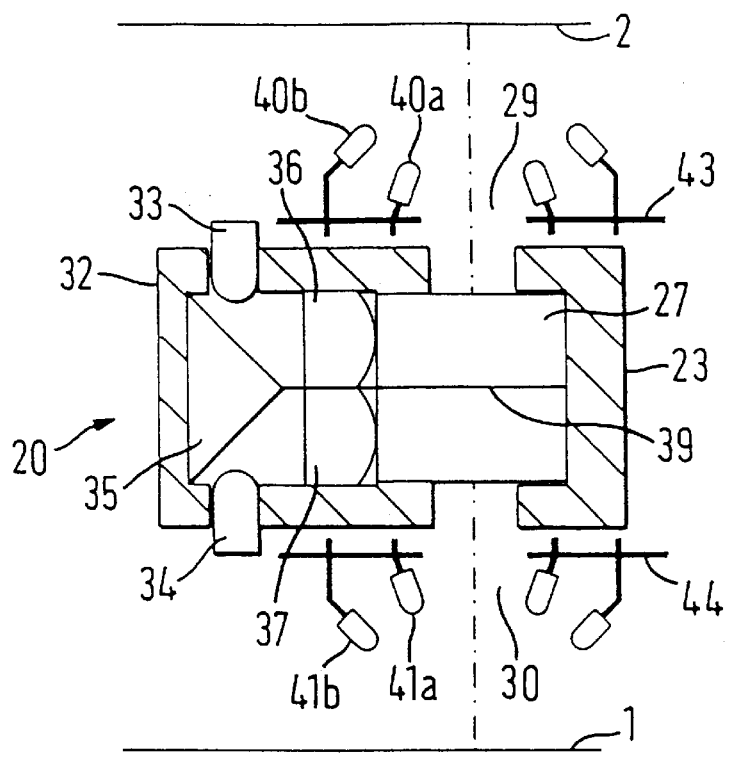

FIGS. 3a, 3b and 3c are schematic views, partially cut away, of an imaging device in the form of a video probe 20 embodying the invention. FIG. 3a is a plan view of the probe with the top cut away to illustrate the viewing apparatus. FIG. 3b is a schematic cross-section along line A—A of FIG. 3a showing a side view of the probe. FIG. 3c is a schematic cross-section along line B—B of FIG. 3a showing an end view of the probe. In FIGS. 3b and 3c, the probe 20 is shown located between a screen 2 and board 1 to be viewed.

Figure 1:
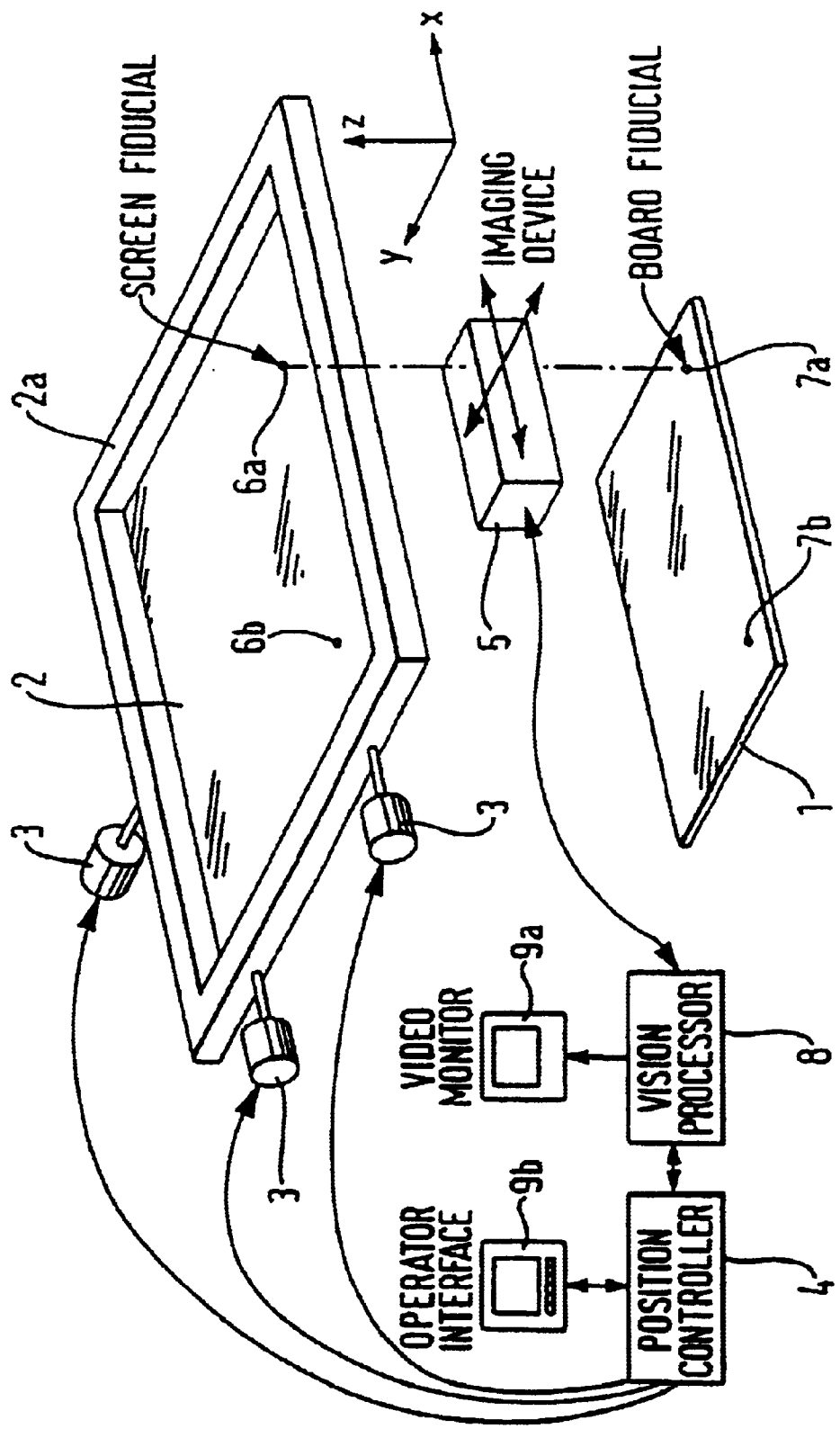
FIG. 1 is a schematic illustration of the general arrangement of a screen printer.
Figure 2:
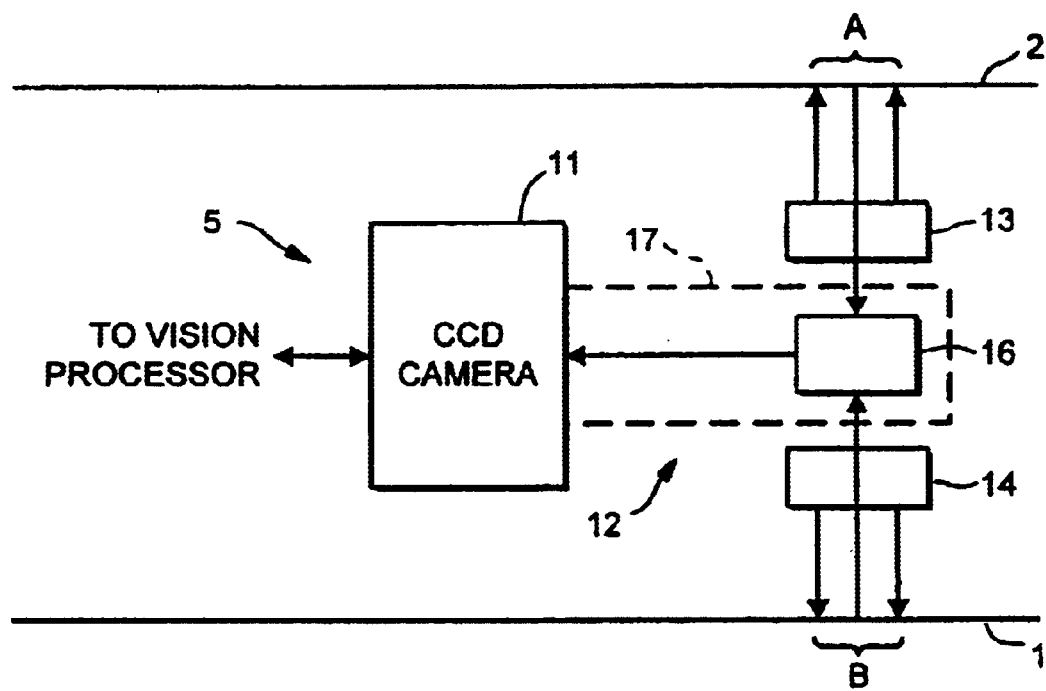
FIG. 2 illustrates schematically the general arrangement of a known imaging device for a screen printer.

The probe 20 comprises a CCD camera 21 and viewing apparatus indicated generally at 22 for illuminating and viewing regions of the screen 2 and board 1 to be imaged. In use, the CCD 21 is connected to the vision processor 8 (FIG. 1) to supply video images thereto and to receive control signals from the vision processor and operator interface 9b (FIG. 1). The viewing apparatus 22 comprises a housing 23 defining a return light channel 24 containing a lens system 25 which focuses return light via telecentric stop 26 onto the imaging plane of the CCD 21. The return light channel 24 also contains a beamsplitting plate 27 and a roof prism 28 arranged as shown in the figures. The roof prism 28 is located between apertures 29 and 30 in the housing 23 for passage of light between the roof prism and the screen and board respectively.

As shown in FIGS. 3a and 3c, lighting means, indicated generally at 32, is mounted on one side of the return light channel 24. The lighting means 32 provides the direct lighting for the screen 2 and board 1. As most easily seen in FIG. 3c, the direct lighting means 32 comprises screen and board LEDs, 33 and 34 respectively, between which is mounted a further roof prism 35. Upper and lower collimating lenses 36 and 37 are located adjacent the roof prism 35.

As illustrated in side view in FIGS. 3b and 3c and shown hatched in FIG. 3a, a light barrier in the form of a thin membrane 39 extends between the point of the roof prism 35, the beamsplitting plate 27 and the point of the roof prism 28. The membrane 39 may be any suitable light barrier, for example a thin stainless steel sheet which is blackened to minimise reflections. The membrane 39 is aligned with the optical axis O of the return light channel 27 in a plane substantially parallel to the screen 2 and board 1.

As seen in FIGS. 3b and 3c, additional lighting is provided adjacent the apertures 29, 30 in the housing 23. On the screen side, two rings of LEDs 40a and 40b are provided around the aperture 29, the LEDSs in each ring being angled so as to point generally towards the screen field of view. Although not shown in these figures, the inner ring 40a may comprise 12 LEDs in total, and the outer ring 40b may comprise 16 LEDs in total. Similarly, two rings of LEDs 41a and 41b are provided on the board side adjacent the aperture 30. The LEDs 40a and 40b provide diffuse lighting for illuminating the screen 2 with light from many different directions, and the LEDs 41a, 41b similarly provide diffuse lighting for the board 1. The LEDs 40a and 40b are mounted on a lighting control circuit board 43 on which control and drive circuitry for the LEDs is provided as discussed further below. Similarly, the LEDs 41a and 41b are mounted on a lighting control board 44. Suitable connections (not shown) are provided between the lighting control boards 43, 44 and the CCD 21 to allow control of the diffuse lighting by the camera 21, vision processor 8 and operator interface 9b (FIG. 1). The direct lighting LEDs 33, 34 are also connected to the lighting control boards 43, 44 for control thereby. The various LEDs can be independently controlled and adjusted as discussed further below.

Considering first direct lighting of the screen 2, when the screen LED 33 is on, light from LED 33 travels vertically down to prism 35 the surfaces of which are 100% reflective in this embodiment. The light is therefore reflected horizontally through collimating lens 36 until it reaches the thin beamsplitting plate 27. Here, approximately 50% of the light passes straight through plate 27 and is absorbed by the housing wall and effectively lost. The other 50% of the light is reflected by the beamsplitter 27 towards the second roof prism 28. Again, the surfaces of the prism 28 are 100% reflective in this embodiment so that the light is reflected vertically upwards to illuminate the screen 2. The direct illumination is substantially collimated so that the light is substantially parallel and incident generally perpendicular to the screen 2. In practice, there is usually a small cone angle of incidence, and this is in fact desirable for imaging purposes It will be seen that the presence of membrane 39 ensures that light from screen LED 33 is incident only on the upper surface of roof prism 28, and cannot be reflected by the lower surface of the prism towards the board 1. Similarly operation of board LED 34 allows direct illumination of the board 1, the membrane 39 preventing this light being reflected from the upper surface of roof prism 28 towards the screen 2. Direct light incident on the screen 2 is reflected back towards the upper surface of roof prism 28 and is totally reflected back towards beamsplitter 27. Here, approximately 50% is reflected back to collimating lens 36 and is lost, while the remaining 50% is transmitted through plate 27 along the return light channel 24 and focused by lens system 25 onto the imaging plane of the CCD camera 21. Direct light reflected by the board 1 is reflected by the lower surface of roof prism 28 and follows a similar return path to CCD camera 21. In this embodiment, screen and board images are formed side by side on the CCD array within the camera 21.

It will be seen that the above arrangement allows the direct screen and board lighting to be introduced into the return light channel 24, while the thin membrane 39 prevents cross-talk between the screen and board illumination. Thus, the regions adjacent the apertures 29, 30 of the probe are available for the diffuse lighting LEDs 40a to 41b. Moreover, with the direct lighting system arranged on one side of the probe, a particularly compact design is achieved, the upper and lower surfaces being free for location of the lighting control boards 43 and 44.

Figure 4A:
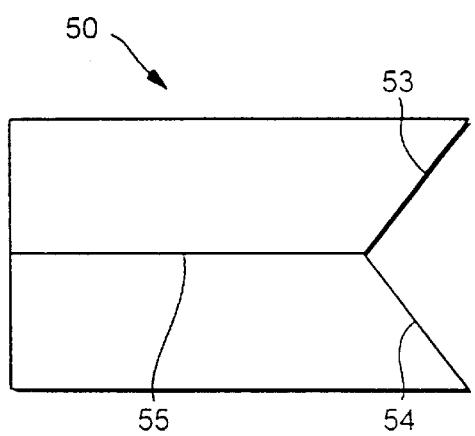
FIGS. 4a and 4b are side and plan views respectively of alternative optical elements for the probe of FIGS. 3a to 3c.
Figure 4B:
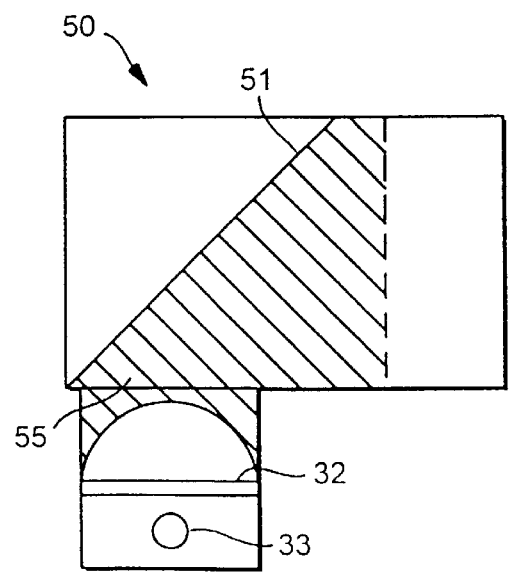

As an alternative to the arrangement shown in FIG. 3c, the roof prism 35 could be omitted and the direct lighting LEDs 33 and 34 located at the left-hand end of the probe housing as seen in FIG. 3c to emit light directly towards the collimating lenses 36 and 37, respectively. Here, the membrane 39 would extend up to the probe housing on the left-hand side of FIG. 3c to prevent cross-talk between the screen and board lighting, A further alternative to the optical arrangement of FIGS. 3a to 3c is illustrated in FIGS. 4a and 4b. Specifically, the beamsplitting plate 27 and roof prism 28 can be replaced by a beamsplitting prism arrangement illustrated generally at 50. FIG. 4a shows a side view of the prism arrangement, corresponding to FIG. 3b, and FIG. 4b shows a plan view corresponding to FIG. 3a.

As illustrated, the prism arrangement 50 has an internal beamsplitting surface 51 which performs the function of the beamsplitting plate 27 in the embodiment previously described. Similarly, the internal angled surfaces 53 and 54 in FIG. 4a perform the function of the upper and lower surfaces of the roof prism 28 in the earlier embodiment. An optical barrier 55 in the form of a thin membrane of substantially non-reflective material extends through the centre of the prism arrangement and preferably also outwardly towards the direct lighting optics 32 in similar fashion to the membrane 39 in the earlier embodiment.

While the arrangement of FIGS. 4a and 4b illustrates one alternative to the earlier embodiment, and other arrangement will be apparent to those skilled in the art, the external surfaces of the prism arrangement 50 provide potential light reflecting surfaces and make it more difficult to eliminate stray light in the system. Thus, the arrangement of FIGS. 3a to 3c is preferred in practice.

The lighting boards 43, 44 allow independent control of the direct LEDs 33, 34 and the inner and outer rings of diffuse lighting LEDs 40a to 41b on both the screen and board side. In addition, each ring of diffuse lighting LEDs is divided into four quadrants allowing independent control of illumination from the x and y directions. Intensity control is also provided and the control system is capable of pulsing the illumination to provide pseudo-continuous lighting and to allow images to be acquired while the probe is in motion between the screen 2 and board 1. The lighting control system will now be discussed in more detail with reference to FIGS. 5 to 10.

Figure 5:
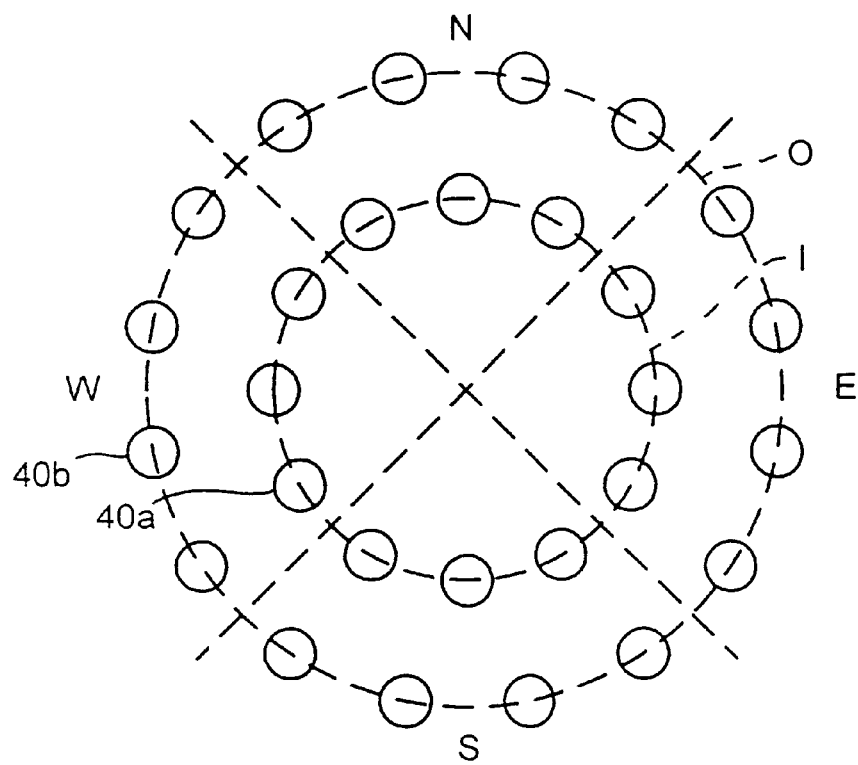
FIG. 5 illustrates the arrangement of the diffuse ring lighting used in the probe of FIGS. 3a to 3c.
Figure 6:
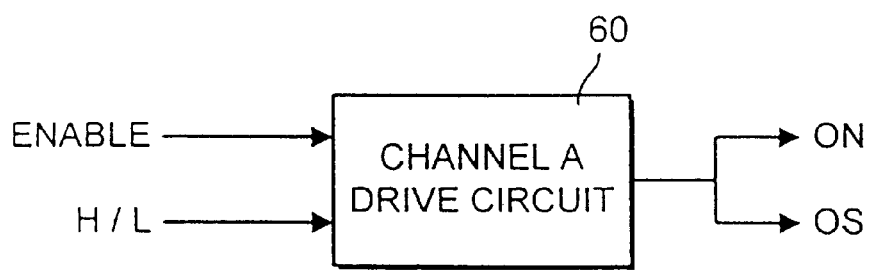
FIG. 6 shows a drive circuit for part of the ring lighting of FIG. 5.

FIG. 5 is a schematic plan view of the diffuse lighting rings 40a and 40b on the screen side. As shown, the LEDs are arranged in concentric rings, the inner ring being labelled I and the outer ring labelled O in the figure. The inner ring I is shown as consisting of 12 LEDs, and the outer ring O of 16 LEDs. For control purposes, the rings I, O are divided into quadrants in the xy plane as illustrated by the broken lines. The quadrants are labelled for convenience as north (N), south (S), east (E) and west (W). Opposing quadrants in each ring are tied together for control purposes, so that the diffuse screen lighting consists of four independently controllable light channels as follows:

Channel A: ON+OS
Channel B: OE+OW
Channel C: IN+IS
Channel D: IE+IW

Each lighting channel can be switched on and off independently of the others, and also switched between the two current settings, by a respective drive circuit provided on the lighting control board 43. The drive circuit for one channel, channel A, is illustrated schematically in FIG. 6. As illustrated, the drive circuit 60 controls the two quadrants ON and OS together in response to two inputs from a controller on the board 43 to be described below. Specifically, the drive circuit 60 receives an ENABLE input which can be either high or low depending on whether the channel A LEDs are to be on or off. By switching this ENABLE input between its two states, the light output can be pulsed. The circuit 60 also receives a high/low (H/L) input for switching between high and low intensity by varying the current through the channel A LEDs. For example, when the H/L input is high a current of 550 mA may be selected, and when the H/L input is low a current of 70 mA may be selected. Suitable transistor logic for implementing the drive circuit will be readily apparent to those skilled in the art.

Three similar drive circuits 60 are provided for lighting channels B to D, each circuit receiving ENABLE and H/L inputs from the controller, and each controlling the associated pair of LED quadrants. In addition, one further drive circuit is provided on the control board 43 for controlling the direct screen LED 33, which therefore constitutes a further lighting channel, channel E. The channel E drive circuit operates similarly to the drive circuit 60, receiving ENABLE and H/L inputs, but in this case drives only the single LED 33. In addition, the high/low current settings for the direct LED 30 in this embodiment are different, namely 800 mA and 100 mA respectively.

Figure 7:
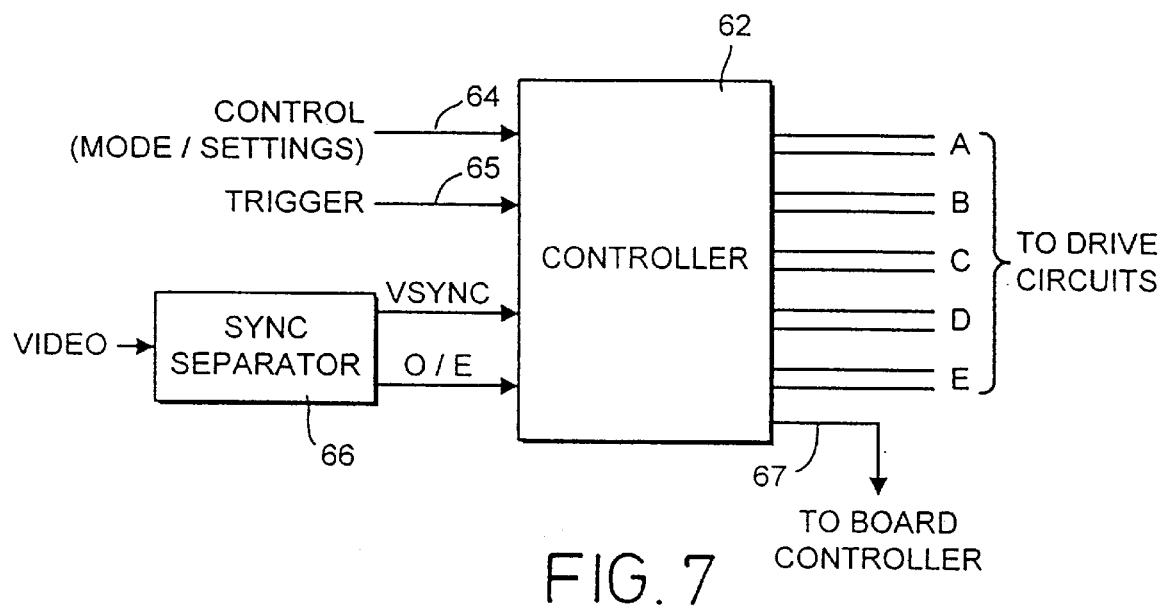
FIG. 7 is a block diagram of lighting control circuitry of the probe.

FIG. 7 shows the main control circuitry on the lighting control board 43 for controlling the drive circuits for the five lighting channels A to E. The control circuitry comprises a microcontroller 62 which, as indicated, has five pairs of outputs connected to the ENABLE and H/L inputs of the drive circuits for the five lighting channels A to E. The controller 62 has a control input 64 which is used to set the lighting mode to one of three modes, namely off, continuous or triggered, and also to set the current level (high or low) and pulse width (ENABLE high period) for each of the lighting channels. The control signals are supplied to the control input 64 from the vision processor 8 and operator interface 9b (FIG. 1) in use. The controller 62 also has a trigger input 65 which, in the triggered mode of operation, receives trigger signals from the vision processor 8, for triggering the light pulses. The control circuitry also includes a sync separator 66 which receives the video signal from the CCD camera 21 for timing of the light pulses in the continuos mode of operation. The sync separator 66 extracts the vertical sync pulse from the video signal and supplies this to the controller 62, together with a field polarity signal O/E which indicates the polarity, ie. odd or even, of the video fields.

In this embodiment, the controller 62 also has an output 67 which is connected to the control input of a corresponding microcontroller on the lighting control board 44 for controlling lighting of the board 1. The board lighting control circuitry corresponds generally to the screen lighting control circuitry just described, having a microcontroller corresponding to the screen lighting controller 62, with corresponding inputs and outputs for controlling the equivalent lighting channels A to E on the board side via drive circuits as described above. However, in this embodiment, the screen controller 62 acts as a master controller, relaying control signals, indicating operational mode and board lighting settings, received on its input 64 via the output 67 to the board controller. Of course, in alternative embodiments, the board controller could receive its control inputs directly from the vision processor/operator interface.

Figure 8:
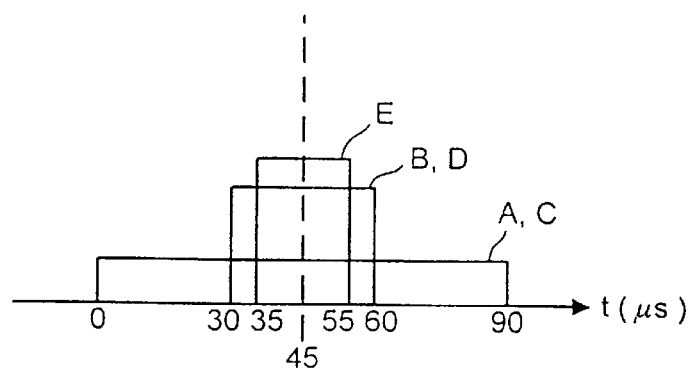
FIG. 8 illustrates an example of pulse timing for the probe lighting.

As described above, for each lighting channel the current level is switchable from high to low by the H/L input to the drive circuit. However, intensity adjustment is also provided by controlling the ENABLE inputs to vary the duration of light pulses emitted by each light channel. Specifically, by varying the ON time of a light channel, the width of the resulting light pulse can be varied to effectively provide further intensity adjustment. The pulse widths for each channel can be set by an operator from the operator interface 9b (FIG. 1) and input to the lighting control circuitry via the control input 64 of the controller 62 in FIG. 7. The controller 62 then determines the start times for the pulses on each channel so that the pulse widths for all channels activated are centred on the same point in time. When settings are adjusted by the operator, or adjusted automatically by the vision processor during normal operation, the controller 62 performs the necessary timing adjustments to maintain coincidence of the pulse mid-points. FIG. 8 illustrates this for the lighting channels A to E of the screen lighting. In this example, channels A and C are set to the low current setting and a pulse width of 90 microseconds. Channels B and D are set to the high current setting with a pulse width of 30 microseconds. Channel E (the direct screen lighting) is set to the high current setting which is greater than that for the diffuse lighting channels with a pulse width of 20 microseconds. With these settings, the controller 62 would enable channels A and C at time t=0, channels B and D at time t=30, and channel E at time t=35. Channel E is disabled at time t=55, channels B and D at time t=60, and channels A and C at time t=90. As illustrated in FIG. 8, this results in the pulses from all channels being centred at the same point in time, t=45. Thus, the acquired image of the screen is effectively frozen at t=45, even though the duration and intensity of lighting from the various channels is different.

While FIG. 8 illustrates one example for the screen lighting only, if the probe is to acquire simultaneous images of the board 1 and screen 2, then the pulses for both the screen and the board lighting must be centred on the same point in time. Thus, when lighting channels on both screen and board side are active, the controller 62 identifies the longest pulse width from the input settings, and computes the ENABLE switching times for the active channels accordingly. In this embodiment, the switching information for the board lighting is relayed by the controller 62 to the board lighting control circuitry. Of course, in alternative embodiments the board controller could perform the necessary calculations independently.

Figure 9:
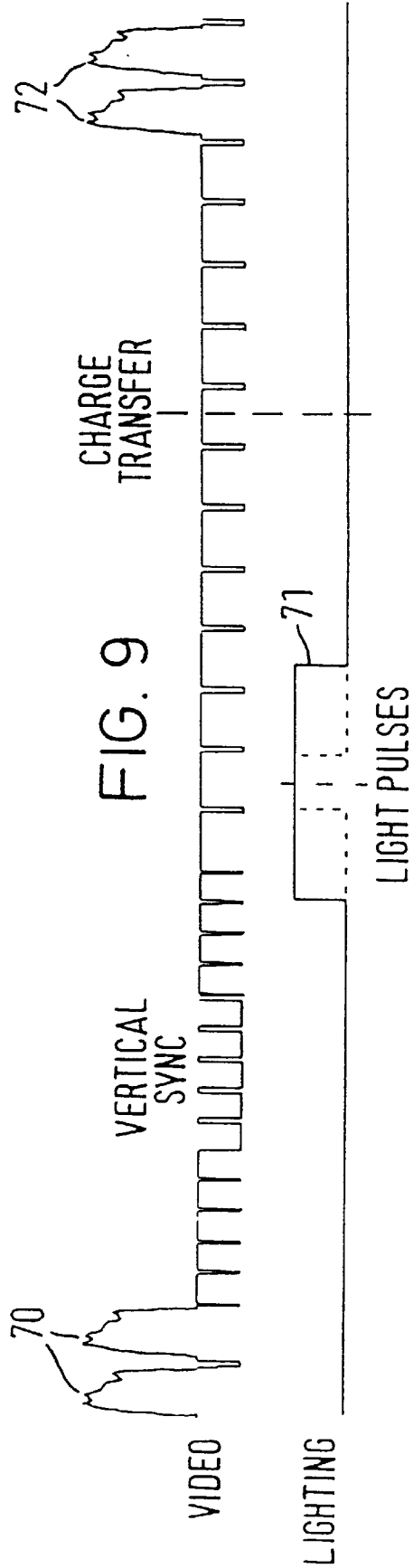
FIG. 9 illustrates pulse timing relative to a video signal output by the probe.

As indicated above, the lighting control circuitry is operable in continuous and triggered modes. The continuous mode of operation can be used for set-up purposes, to allow the operator to adjust and optimise the various settings. The continuous mode can also be used for inspection purposes, to allow the operator to check the screen, for example for aperture blockage or contamination, and to check the printed board for missing print, misaligned print, or excess print causing individual print features to join together. In the continuous mode, any combination of the screen and board lighting channels may be activated as required, though at least some of the diffuse lighting channels are usually used for inspection purposes. Whatever channels are activated, in the continuous mode each channel emits one pulse per frame of the video signal relayed to the vision processor, the pulses being centred on the same point in time as described above. The pulse timing is synchronised with the video signal in accordance with the Vsync and field polarity signals O/E derived by the sync separator 66 in FIG. 7 and the corresponding sync separator of the board lighting control circuit. Specifically, the pulse timing is sequenced from the trailing edge of the vertical sync pulse in each odd field. This is illustrated in FIG. 9 which shows an example of the timing of the light pulses relative to the video signal output by the CCD 21 which is of the interline transfer type in this case. In FIG. 9, the line outputs from the previous field (even field) are indicated at 70. These are followed by the vertical sync signal which is detected by the sync separators to provide the Vsync output to the lighting controllers. The controllers then commence the light pulse sequencing for the active channels as indicated schematically at 71. This momentarily illuminates the screen 2 and/or board 1, depending on the active channels, and the resulting image is captured by the CCD 21. Following the charge transfer operation in the CCD 21, the image data is readout in the following two fields of the video signal, the first few lines being indicated at 72.

Figure 10:
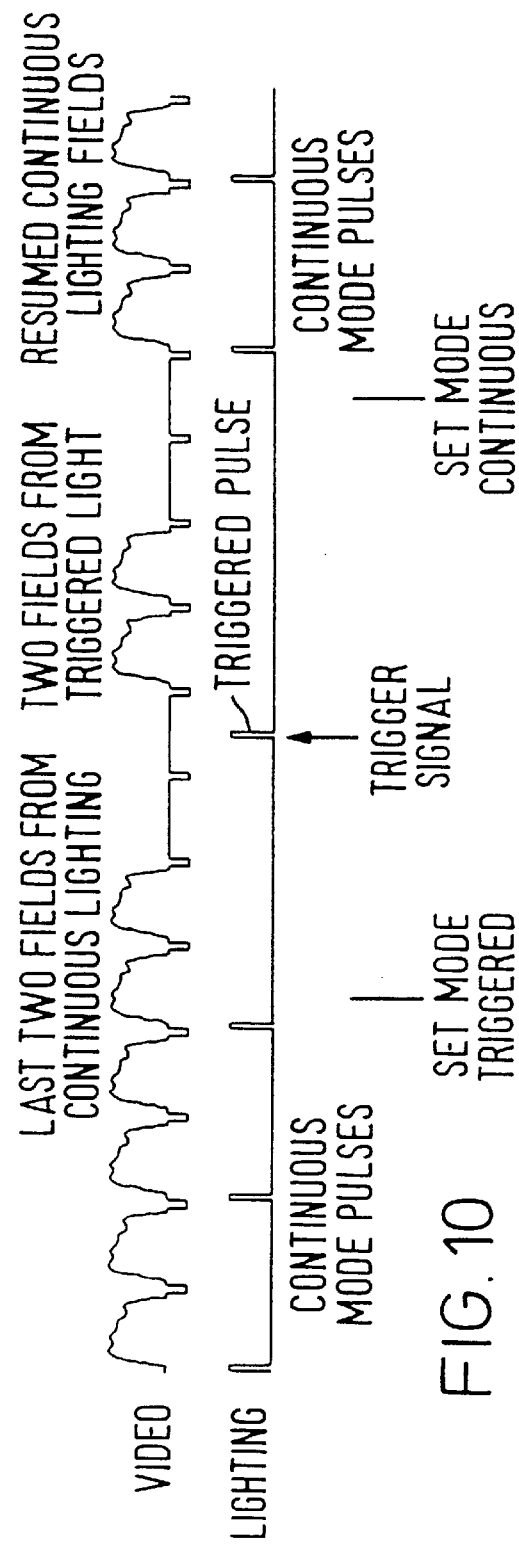
FIG. 10 illustrates pulse timing, relative to the output video signal in continuous and triggered modes of the operation.

In the triggered mode of operation, light pulses from the active channels are again sequenced so as to be coincident in time as described above, but the channels are only activated periodically in response to a trigger signal supplied by the vision processor to the trigger inputs 65 of the screen and board controllers. This mode is used for fiducial capture, when the probe is moved automatically along a path through the fiducial locations, and at each location, acquires a simultaneous image of the screen and board fiducials. Only the board and screen direct lighting channels are generally used for the fiducial capture process. However, difffuse lighting channels can also be operated in the triggered mode if desired, eg. in an automated inspection process. Either way, on receipt of a trigger signal the light pulse sequence for the active channels is commenced immediately, and the resulting image captured by the CCD 21 is output as the following two fields of video data. FIG. 10 illustrates the light pulse timing in relation to the output video signal over a transition between continuous and triggered modes.

In the embodiment described above, a wide range of lighting conditions can be achieved by selecting the current setting, and varying the pulse width, for each light channel independently. The pulse width should preferably be short in comparison with the video field period, but can still be adjusted over a wide range, for example between 10 and 250 microseconds. It will be appreciated that, in the continuous mode, a pseudo-continuous lighting effect is achieved allowing continuous monitoring by an operator while the probe is in motion without problems of image blur and while still providing the same lighting effects as in the triggered mode. Moreover, since the pulses are synchronised with the video signal, image flicker is avoided. Further, in both continuous and triggered modes, though the pulse width varies between light channels, the pulses are centred on the same point in time to ensure that the moving image is effectively frozen in the same position by each light channel.

While preferred embodiments of the invention have been described above, it is to be understood that many variations and modifications may be made without departing from the scope of the invention. By way of example, it will be appreciated that light pulses could be obtained by activating a shutter in front of a continuously-on light source, though pulsing by on/off switching of the light sources is preferred. Further, while embodiments applied to screen printers have been specifically described, embodiments of the invention can of course be used in other systems where similar techniques are used. For example, embodiments of the invention could be applied in component placement systems or semiconductor wafer fabrication systems (eg. for reticle/wafer alignment), and many other fields where an object or objects are to be viewed or imaged for inspection or positioning purposes for example.

What is claimed is:

1. Imaging apparatus for acquiring images of regions, in particular of one or both of a screen and board in a screen printer, the apparatus comprising:

a plurality of lighting units for illuminating regions to be imaged;

an imaging unit for acquiring images of the regions illuminated by the lighting units; and a control unit for controlling each lighting unit to generate a pulse of light, wherein the control unit is operable to control the lighting units to generate respective pulses of different durations such that the pulses of light from respective lighting units have coincident temporal midpoints.

2. Apparatus as claimed in claim 1, wherein the control unit is operable to vary the pulse duration of one or more of the lighting units in response to a control signal.

3. Apparatus as claimed in claim 1, wherein the lighting units comprise direct lighting units for illuminating the regions with substantially collimated light.

4. Apparatus as claimed in claim 3, wherein the lighting units comprise diffuse lighting units for illuminating the regions with diffuse light.

5. Apparatus as claimed in claim 1, wherein the lighting units comprise diffuse lighting units for illuminating the regions with diffuse light.

6. Apparatus as claimed in claim 1, wherein the control unit is operable to control the lighting units to generate respective pulses repeatedly.

7. Apparatus as claimed in claim 1, wherein the control unit is operable to control the lighting units to generate respective pulses of light in response to an external control signal received by the control unit.

8. A method of acquiring images of regions, in particular of one or both of a screen and board in a screen printer, the method comprising the steps of:

operating a plurality of lighting units to generate respective pulses of light for illuminating regions to be imaged;

controlling the lighting units to generate respective pulses of different durations such that the pulses of light from respective lighting units have coincident temporal midpoints; and acquiring images of the regions illuminated by the lighting units.

* * * * *